US008330936B2

(12) United States Patent
Streefkerk et al.

(10) Patent No.: US 8,330,936 B2
(45) Date of Patent: Dec. 11, 2012

(54) LITHOGRAPHIC APPARATUS AND DEVICE MANUFACTURING METHOD

(75) Inventors: Bob Streefkerk, Tilburg (NL); Youri Johannes Laurentius Maria Van Dommelen, Eindhoven (NL); Richard Moerman, Son (NL); Cédric Désiré Grouwstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 661 days.

(21) Appl. No.: 11/523,743

(22) Filed: Sep. 20, 2006

(65) Prior Publication Data

US 2008/0068570 A1    Mar. 20, 2008

(51) Int. Cl.
  *G03B 27/42*  (2006.01)
  *G03B 27/32*  (2006.01)
(52) U.S. Cl. ............................ 355/53; 355/77
(58) Field of Classification Search ............ 355/53, 355/72, 75, 77, 30
  See application file for complete search history.

(56) References Cited

U.S. PATENT DOCUMENTS

| 4,509,852 | A | 4/1985 | Tabarelli et al. | 355/30 |
|---|---|---|---|---|
| 6,277,533 | B1* | 8/2001 | Wakamoto et al. | 430/30 |
| 6,342,942 | B1 | 1/2002 | Uzawa | |
| 6,576,919 | B1* | 6/2003 | Yoshida | 250/548 |
| 6,734,117 | B2* | 5/2004 | Sogard | 438/795 |
| 2003/0147060 | A1* | 8/2003 | Tokuda et al. | 355/53 |
| 2004/0136494 | A1 | 7/2004 | Lof et al. | 378/34 |
| 2004/0207824 | A1* | 10/2004 | Lof et al. | 355/30 |
| 2005/0036121 | A1* | 2/2005 | Hoogendam et al. | 355/30 |
| 2005/0103260 | A1* | 5/2005 | Lee | 117/103 |
| 2005/0238970 | A1 | 10/2005 | Vries | |
| 2005/0259234 | A1* | 11/2005 | Hirukawa et al. | 355/53 |
| 2006/0038968 | A1 | 2/2006 | Kemper et al. | 355/18 |
| 2006/0038970 | A1* | 2/2006 | Kamijima et al. | 355/53 |
| 2006/0082747 | A1* | 4/2006 | Fukuhara et al. | 355/53 |
| 2006/0158627 | A1 | 7/2006 | Kemper et al. | 355/53 |
| 2007/0285639 | A1* | 12/2007 | Liang et al. | 355/53 |

FOREIGN PATENT DOCUMENTS

| EP | 1 420 299 A2 | 5/2004 |
|---|---|---|
| EP | 1 420 300 A2 | 5/2004 |
| EP | 1 524 555 A1 | 4/2005 |
| EP | 1 420 300 A3 | 8/2005 |
| EP | 1 775 635 A1 | 4/2007 |
| JP | 2000-021702 A | 1/2000 |
| JP | 2005-072132 A | 3/2005 |
| JP | 2005311378 A | 11/2005 |
| JP | 2006114765 A | 4/2006 |
| WO | WO 99/49504 | 9/1999 |
| WO | 2005/106930 A1 | 11/2005 |

OTHER PUBLICATIONS

Martinus Hendrikus Antonius Leenders, U.S. Appl. No. 11/404,091, filed Apr. 14, 2006.
Harry Van Der Schoot, U.S. Appl. No. 11/472,566, filed Jun. 22, 2006.
European Search Report dated Feb. 7, 2008 for European Application No. 07 25 3692.

(Continued)

*Primary Examiner* — Toan Ton
*Assistant Examiner* — Steven H Whitesell Gordon
(74) *Attorney, Agent, or Firm* — Pillsbury Winthrop Shaw Pittman LLP

(57) ABSTRACT

A path which a substrate should take under the projection system during immersion lithography imaging of a plurality of dies on the top surface of the substrate is disclosed.

20 Claims, 8 Drawing Sheets

OTHER PUBLICATIONS

English translation of Korean Official Action issued on Jan. 20, 2009 in Korean Application No. 10-2007-0095195.

Office Action in related Japanese Application No. 2007-237470 mailed Feb. 26, 2009.

\* cited by examiner

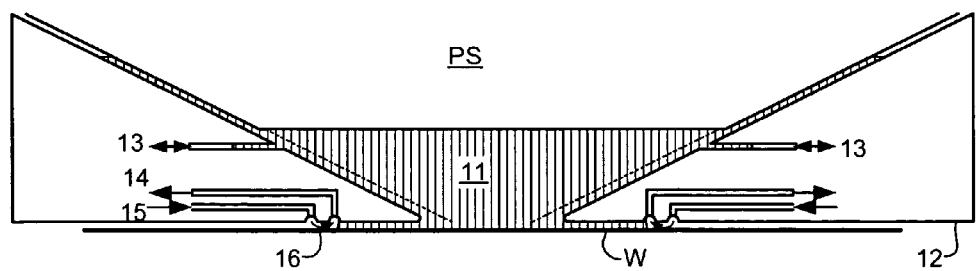
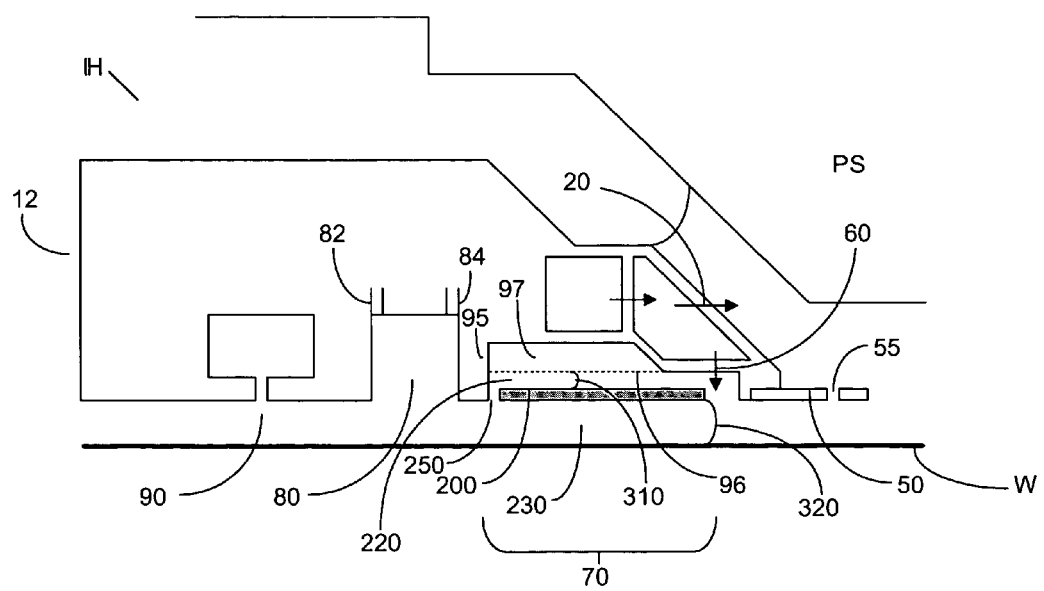

LITHOGRAPHIC APPARATUS AND DEVICE MANUFACTURING METHOD

FIELD

The invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

A problem with immersion lithography is the introduction of imaging defects in the product due to the use of immersion liquid on the top surface of the substrate. Most of these imaging defects are introduced through particles in the immersion liquid.

SUMMARY

It is desirable to reduce the defects introduced by use of immersion liquid in an immersion lithographic projection apparatus. In an embodiment, both particle printing and liquid droplets left behind after imaging which lead to liquid marks are reduced.

According to an aspect of the invention, there is provided a lithographic apparatus comprising: a support constructed to support a patterning device, the patterning device being capable of imparting a radiation beam with a pattern in its cross-section to form a patterned radiation beam; a substrate table constructed to hold a substrate; a liquid supply system configured to provide liquid to a localized area of a top surface of a substrate; a projection system configured to project the patterned radiation beam onto a target portion of the substrate through the liquid; and a controller adapted to coordinate movement of the substrate table and the support during imaging of a line of dies across the substrate such that this is accomplished by movement of the line of dies under the projection system backwards and/or forwards only in a direction substantially parallel to a first direction which first direction is in a plane substantially parallel to the top surface.

According to a further aspect of the invention, there is provided a lithographic apparatus comprising: a support constructed to support a patterning device, the patterning device being capable of imparting a radiation beam with a pattern in its cross-section to form a patterned radiation beam; a substrate table constructed to hold a substrate; a liquid supply system configured to provide liquid to a localized area of a top surface of a substrate; a projection system configured to project the patterned radiation beam onto a target portion of the substrate through the liquid; and a controller adapted to control movement of the support and the substrate table such that the substrate table moves in a first direction in a plane substantially parallel to the top surface during imaging of a line of dies on the substrate and the support is moved such that the substrate is scanned in the first direction during exposure of each of the dies.

According to a further aspect of the invention, there is provided a lithographic apparatus comprising; a support constructed to support a patterning device, the patterning device being capable of imparting a radiation beam with a pattern in its cross-section to form a patterned radiation beam; a substrate table constructed to hold a substrate; a liquid supply system configured to provide liquid to a localized area of a top surface of a substrate; a projection system configured to project the patterned radiation beam onto a target portion of the substrate through the liquid; and a controller adapted to control movement of the support and the substrate table such that during imaging of a central section of the substrate scan movements are substantially perpendicular to step movements and during imaging of an outer area of the substrate step and scan movements are either combined or substantially anti-parallel.

According to a further aspect of the invention, there is provided a lithographic apparatus comprising: a support constructed to support a patterning device, the patterning device being capable of imparting a radiation beam with a pattern in its cross-section to form a patterned radiation beam; a substrate table constructed to hold a substrate; a liquid supply system configured to provide liquid to a localized area of a top surface of a substrate; a projection system configured to project the patterned radiation beam onto a target portion of the substrate through the liquid; and a controller adapted to control movement of the support and the substrate table such that during imaging of at least a portion of a top surface of the substrate scan movements and step movements of the substrate table are at least partly combined as one movement or separate movements which are substantially parallel.

According to a further aspect of the invention, there is provided a lithographic apparatus comprising: a support constructed to support a patterning device, the patterning device being capable of imparting a radiation beam with a pattern in its cross-section to form a patterned radiation beam; a substrate table constructed to hold a substrate; a liquid supply system configured to provide liquid to a localized area of a top surface of a substrate; a projection system configured to project the patterned radiation beam onto a target portion of the substrate through the liquid; and a controller adapted to control movement of the support and the substrate table such that during imaging all scan movements are in one direction.

According to a further aspect of the invention, there is provided a device manufacturing method comprising using a projection system to project a patterned beam of radiation onto a substrate through liquid provided between the projection system and the substrate, wherein a line of dies across a substrate is imaged by movement of the line of dies under the projection system backwards and/or forwards only in a direction substantially parallel to a first direction which first direction is in a plane substantially parallel to a top surface of the substrate.

According to a further aspect of the invention, there is provided a device manufacturing method comprising using a projection system to project a patterned beam of radiation onto a substrate through liquid provided between the projection system and the substrate, wherein a line of dies is imaged by moving the substrate in a first direction in a plane substantially parallel to a top surface of the substrate and controlling the patterned beam of radiation such that the substrate is scanned in the first direction during exposure of each of the dies.

According to a further aspect of the invention, there is provided a device manufacturing method comprising using a projection system to project a patterned beam of radiation onto a substrate through liquid provided between the projection system and the substrate, wherein during imaging of a central section of the substrate scan movements are substantially perpendicular to step movements and during imaging of an outer area of the substrate step and scan movements are either combined or substantially anti-parallel.

According to a further aspect of the invention, there is provided a device manufacturing method comprising using a projection system to project a patterned beam of radiation onto a substrate through liquid provided between the projection system and the substrate, wherein scan movements and step movements of the substrate are at least partly combined as one movement or separate movements which are substantially parallel.

According to a further aspect of the invention, there is provided a device manufacturing method comprising using a projection system to project a patterned beam of radiation onto a substrate through liquid provided between the projection system and the substrate, wherein during imaging all scan movements are in one direction.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts, in cross-section, a liquid supply system which can be used in an embodiment of the invention;

FIG. 6 depicts, in cross-section, a further type of liquid supply system which may be used with an embodiment of the invention;

DETAILED DESCRIPTION

Figure 1:
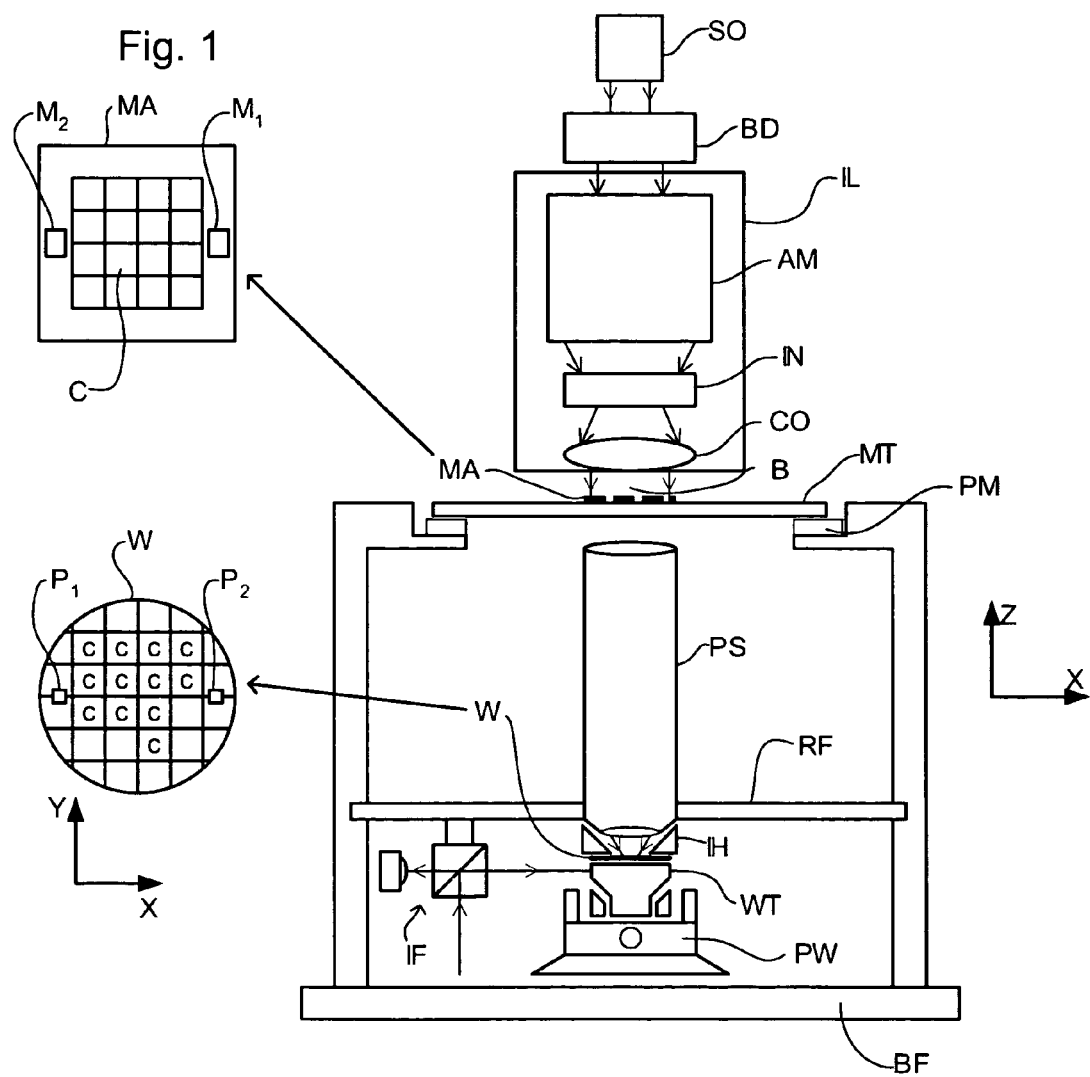
FIG. 1 depicts a lithographic apparatus according to an embodiment of the invention.
Figure 2:
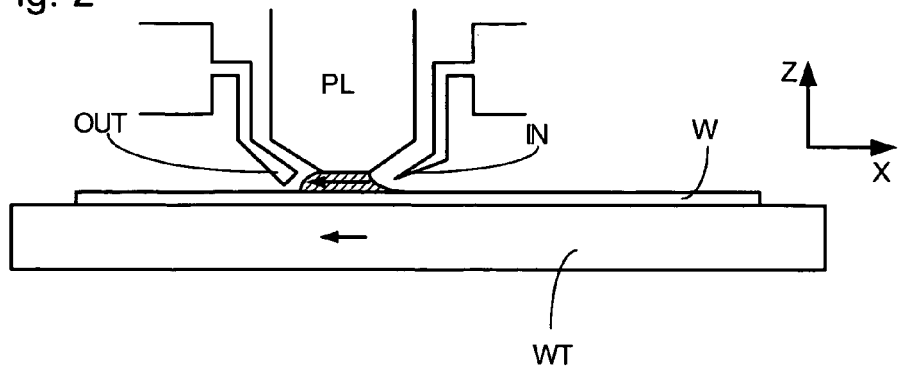
FIGS. 2 and 3 depict a liquid supply system for use in a lithographic projection apparatus.
Figure 3:
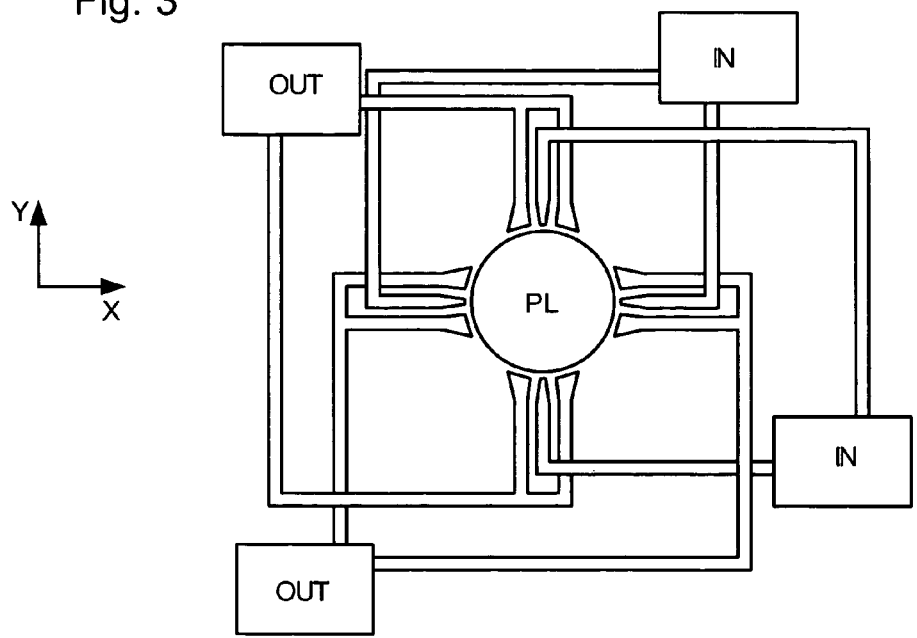
Figure 4:
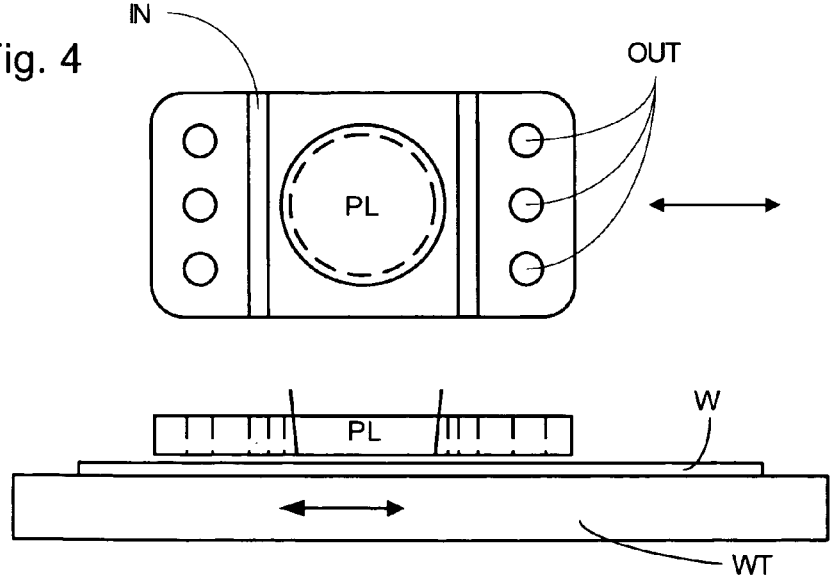
FIG. 4 depicts another liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Another immersion lithography solution with a localized liquid supply system solution which has been proposed is to provide the liquid supply system with a barrier member which extends along at least a part of a boundary of the space between the final element of the projection system and the substrate table. FIG. 5 illustrates, in cross-section, such a liquid supply system IH which can be used to fill the space 11 between the projection system PS and the substrate W with liquid. This liquid supply system is an example only and many other types of liquid supply system which provide liquid to a local area of the substrate (i.e. not over the whole top surface of the substrate at any one time) can be used instead, particularly those without a gas knife and which rely on meniscus pinning features to contain the liquid.

Referring to FIG. 5, the barrier member 12 at least partly contains liquid in the space 11 between a final element of the projection system PL and the substrate W. The barrier member 12 surrounds the bottom edge of the projection system PS. The barrier member is substantially stationary relative to the projection system in the XY plane though there may be some relative movement in the Z direction (in the direction of the optical axis). In an embodiment, a seal is formed between the bottom surface of the barrier member which faces the top surface of the substrate and the surface of the substrate and may be a contactless seal such as a gas seal. A contactless seal 16 to the substrate may be formed around the image field of the projection system so that liquid is confined within the space between the substrate surface and the final element of the projection system. The space is at least partly formed by the barrier member 12 positioned below and surrounding the final element of the projection system PL. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and the substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

FIG. 6 illustrates another type of liquid supply system IH. The barrier member 12 extends around the periphery of the final element of the projection system PS such that the barrier member (which is sometimes called a seal member) is, for example, substantially annular in overall shape.

The function of the barrier member 12 is to at least partly maintain or confine liquid in the space between the projection system PS and the substrate W so that the projection beam may pass through the liquid. The top level of liquid is simply contained by the presence of the barrier member 12 and the level of liquid in the space is maintained such that the liquid does not overflow over the top of the barrier member 12. A seal is provided between the bottom of the barrier member 12 and the substrate W. In FIG. 6 the seal is a contactless seal and is made up of several components. Working radially outwardly from the optical axis of the projection system PS, there is provided a (optional) flow plate 50 which extends into the space (though not into the path of the projection beam) which helps maintain parallel flow of the immersion liquid out of inlet 20 across the space and then out through an outlet (not illustrated) opposite and at the same level as the inlet (so that the immersion liquid flows across the space between the final element of the projection system and the substrate). The flow control plate has one or more through holes 55 in it to reduce the resistance to movement in the direction of the optical axis of the barrier member 12 relative to the projection system PS and/or substrate W. Moving radially outwardly along the bottom of the barrier member 12 there is then provided an inlet 60 which provides a flow of liquid in a direction substantially parallel to the optical axis towards the substrate. This flow of liquid is used to help fill any gaps between the edge of the substrate W and the substrate table WT which supports the substrate. If this gap is not filled with liquid, bubbles may be more likely to be included in the liquid in the space between the projection system PS and the substrate W when an edge of the substrate W passes under the barrier member 12. This is undesirable as it can lead to deterioration of the image quality.

Radially outwardly of the outlet 60 is an extractor assembly 70 configured to extract liquid from between the barrier member 12 and the substrate W. The extractor 70 will be described in more detail below and forms part of the contactless seal which is created between the barrier member 12 and the substrate W.

Radially outwardly of the extractor assembly is a recess 80 which is connected through an outlet 82 to the atmosphere and via an inlet 84 to a low pressure source. Radially outwardly of the recess 80 is a gas knife 90. An arrangement of the extractor, recess and gas knife is disclosed in detail in United States patent application publication no. US 2006-0158627, incorporated herein its entirety by reference. However, in that document the arrangement of the extractor assembly is different.

The extractor assembly 70 comprises a liquid removal device or extractor or outlet 95 such as the one disclosed in United States patent application publication no. US 2006-0038968, incorporated herein its entirety by reference. Any type of liquid extractor can be used. In an embodiment, the liquid removal device 95 comprises an outlet which is covered in a porous material 96 which is used to separate liquid from gas to enable single-liquid phase liquid extraction. A chamber 97 downstream of the porous material 96 is maintained at a slight under pressure and is filled with liquid. The under pressure in the chamber 97 is such that the meniscuses formed in the holes of the porous material prevent ambient gas (e.g., air) being drawn into the chamber 97 of the liquid removal device 95. However, when the porous material 96 comes into contact with liquid there is no meniscus to restrict flow and the liquid can flow freely into the chamber 97 of the liquid removal device 95. The porous material 96 extends radially inwardly along the barrier member 12 (as well as around the space) and its rate of extraction varies according to how much of the porous material 96 is covered by liquid. As further explained below, particles from, for example materials on the substrate, may be present in the immersion liquid.

A plate 200 is provided between the liquid removal device 95 and the substrate W so that the function of liquid extraction and the function of meniscus control can be separated from one another and the barrier member 12 can be optimized for each.

The plate 200 is a divider or any other element which has the function of splitting the space between the liquid removal device 95 and the substrate W into two channels, an upper channel 220 and a lower channel 230 wherein the upper channel 220 is between the upper surface of the plate 200 and the liquid removal device 95 and the lower channel 230 is between the lower surface of the plate 200 and the substrate W. Each channel is open, at its radially innermost end, to the space.

An under pressure can be applied in the upper channel 220, rather than leaving it open to the atmosphere through one or more breathing holes 250, e.g., one or more through holes 250. In this way the upper channel 220 can be made wider.

Thus, with the plate 200, there are two meniscuses 310, 320. A first meniscus 310 is positioned above the plate 200 and extends between the porous material 96 and the top surface of the plate 200 and a second meniscus 320 which is positioned underneath the plate 200 and which extends between the plate 200 and the substrate W. In this way, for example, the extractor assembly 70 can be configured for control of the first meniscus for optimum extraction of liquid and for positional control of the second meniscus 320 such that the viscous drag length for the second meniscus 320 is reduced. For example, the characteristics, in particular of the plate 200, may be optimized to make it energetically favorable for the meniscus 320 to remain adhered to the plate 200 such that the scan speed of the substrate W beneath the barrier member 10 can be increased. Capillary forces acting on the second meniscus 320 are outwards and are balanced by an under pressure in the liquid adjacent the meniscus so that the meniscus stays still. Higher loading on the meniscus, for example by viscous drag and inertia, results in a lowering of the contact angle of the meniscus with the surface.

As noted above, one or more breathing holes 250 may be provided at the radially outward most end of the plate 200 such that the first meniscus 310 is free to move inwardly and outwardly beneath the porous material 96 so that the extraction rate of the liquid removal device 95 can vary according to how much of the porous material 96 is covered by liquid. As illustrated in FIG. 6 the second meniscus 320 is adhered to a lower innermost edge of the plate 200. In FIG. 6, the innermost lower edge of the plate 200 is provided with a sharp edge so as to pin the second meniscus 320 in place.

Although not specifically illustrated in FIG. 6, the liquid supply system has a means for dealing with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery of the barrier member 12 during movement of the barrier member 12 relative to the projection system PS. In an alternative or additional arrangement, liquid may be removed from the top of the barrier member 12 using, for example, an extractor such as a single phase extractor similar to the extractor 96.

Thus, it can be seen that there are several ways in which immersion liquid is removed from the space between the final element of the projection system and the substrate. These include immersion liquid which flows across the space out of inlet 20 and into an outlet opposite the inlet 20 (the outlet is not illustrated). This immersion liquid may or may not be irradiated depending upon when the projection beam PB is activated. Immersion liquid is removed by the extractor 70 and this immersion liquid is likely to be extracted as a single phase. Other immersion liquid which escapes the extractor 70 could be collected by the recess 80 and gas (or fluid-inert gas) knife 90 combination. Any such immersion liquid extracted is likely to be a combination of liquid and gas. Finally, liquid is also likely to be removed from the space through the substrate table WS from between the edge of the substrate W and the substrate table WS. This is also likely to have a high amount of gas. Liquid which has been in contact with a top surface of the substrate (i.e. the resist) may also be contaminated by leaching so that liquid may be best treated in a particular way different to other liquid, as described below.

U.S. Ser. Nos. 11/472,566 and 11/404,091, which are incorporated herein in their entirety by reference, also disclose liquid supply systems. Any of those liquid supply systems may be used in an embodiment of the invention, particularly those in which the barrier member 12 is actuated i.e changes in height and/or X or Y position or rotation about either or both of those axes with respect to the projection system PS.

During imaging of a substrate W (which includes both the time that the top surface of the substrate is actually irradiated e.g. during a scan movement, as well as the time which the substrate W spends moving in order to arrive at a position at which imaging can start e.g. during a step movement), the substrate W moves through a path which is generally in a plane substantially parallel to the top surface of the substrate W. However, in order to account for changes in the height of the substrate, the substrate may also shift up and down in the direction of the optical axis and may also rotate about an axis substantially perpendicular to the optical axis to account for changes in height in the top surface of the substrate W. However, the main movement is in a plane substantially parallel to the top surface of the substrate. An embodiment of the invention is directed to the main movements, but the other minor movements to account for the non-smooth top surface of the substrate mentioned above may also be taking place.

Conventionally the path which the substrate W traverses during imaging is optimized to minimize the amount of time it takes to image the whole of the top surface of the substrate. In the so called step and scan method, a typical path might be that illustrated in FIG. 7. As can be seen, the substrate W is covered in a number of dies which are rectangular and which are numbered in the order in which they are exposed. Thus die number "1" is exposed first followed by die number "2" and that is followed by die number "3", etc. In this description, 'upwards' and downwards' refer to directions relative to the drawings. Actually, the directions are likely to be +/−X directions, for example.

The substrate W is moved under the projection system in a step motion from the position at which die number 1 ends up after being exposed to a position at which die number 2 can start to be exposed. Each individual die is scanned over the substrate W during exposure. During a scan movement, for example, both the substrate W is moved under the projection system PS and the patterning device MA is moved above the projection system by the support structure MT as described above.

Figure 7:
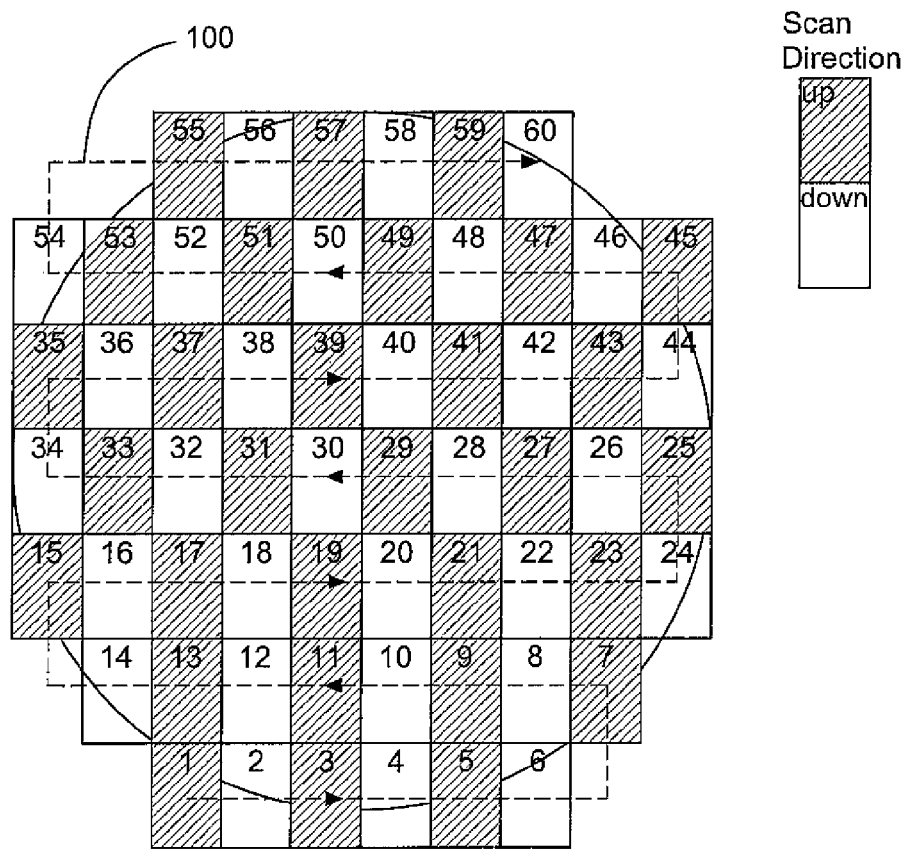
FIG. 7 depicts a schematic diagram illustrating a conventional route of a substrate under the projection system during imaging.

In the example of FIG. 7, the direction of scan (i.e. the direction in which the substrate W moves relative to the projection system) is illustrated by the shading of the respective die. Thus when die number 1 is exposed (the projection system PS is stationary relative to the page), the substrate W moves down the page so that the bottom of die 1 is exposed before the top. Thus, die 1 is scanned up (gray shading). Once the top of die number 1 has been exposed, exposure stops and the substrate W is stepped to the left so that the top of die number 2 is under the projection system. The substrate W is then moved up the page so that the substrate is scanned in a downwards direction in die number 2 during exposure of that die (no shading). Once the bottom of die number 2 has been reached, the substrate W is stepped to the left so that the bottom of die number 3 is positioned under the projection system. These movements together comprise imaging of the substrate i.e. both periods of exposure and periods where exposure is not taking place.

The dotted line labeled 100 in FIG. 7 illustrates the overall path of the substrate W (just the step movements) and the scan movements are not illustrated in line 100 but are indicated by the shading of each individual die. As can be seen, a so called meander path which has been optimized for minimum imaging time has scan and step directions that are substantially perpendicular to one another.

In principle a similar sort of meander path can be used in immersion lithography and indeed this is what has conventionally been done. This may not necessarily be the best approach and that a better approach is to optimize the meander path not only for throughput but also for a reduction in the number of defects which are produced.

Unfortunately immersion liquid carries more foreign particles in it than the usual gas coupling between the projection system PS and the substrate W and liquid droplets may also become a problem. The particles are likely to be of materials on the substrate or from the liquid supply system IH. The liquid supply system may leave a trail of liquid directly behind it. Liquid marks may be produced by droplets which are left behind the liquid supply system as the top surface of the substrate passes under it. The longer these droplets are left behind, the worse the liquid mark may become because of the longer time the droplets can interact with the resist on the top surface of the substrate W. In the path of FIG. 7, particles and/or liquid marks may be left behind from imaging of preceding dies that affect imaging of later dies. Additionally or alternatively, defects may be generated (liquid marks and/or printed particles) during the turning of the substrate W on the top surface of the substrate W. The path of FIG. 7 results in both X and Y movements of the substrate under the liquid supply system which can lead to a higher vectorial speed/centrifugal force which might lead to a higher chance of particle deposition or of liquid droplets being left behind. Specific meandering paths and scan directions to be used with immersion lithographic are disclosed herein in which one or more of or other problems may be alleviated. Ideally the meander paths are such that it is unnecessary for one or more parts of the substrate where droplets and particles have been left behind for a long time and have had a chance to dry and/or interact with the resist to pass under the liquid supply system IH.

The control of the position of the substrate table WT and the support structure MT is coordinated by a controller which can be preprogrammed with a selected meander path. In an embodiment of the invention, the meander path is optimized for both throughput and reduction in defects.

Figure 8:
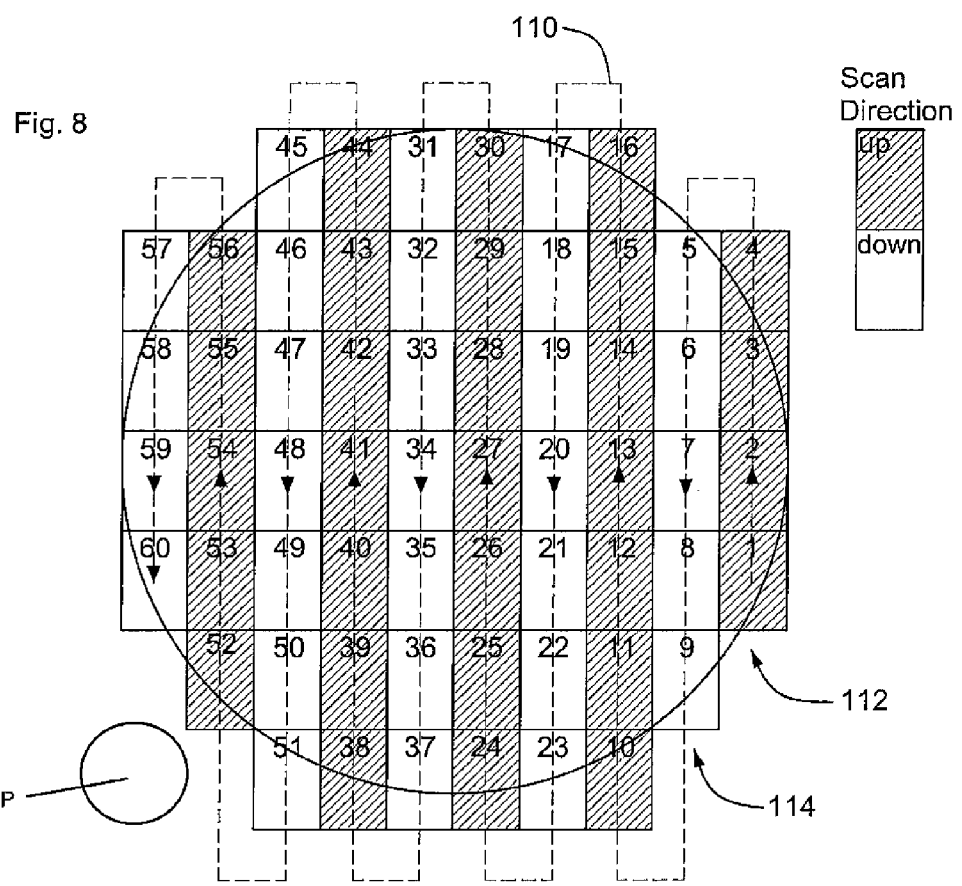
FIG. 8 illustrates an imaging route according to an embodiment of the invention.

FIG. 8 illustrates an embodiment of the invention. An overall path 110 is illustrated in dotted lines and the shading of each individual die, as in FIG. 7, indicates the direction in which it is scanned. It will be immediately apparent that the scan direction of each die is in a direction substantially parallel to a first direction in which the substrate is moved i.e. the stepping direction. All movements of the substrate when under the projection system are only in a direction backwards or forwards in or along a direction substantially parallel to the first direction (substantially parallel or substantially anti-parallel to or within the first direction). This means that the substrate W will move so that the bottom of the die 1 is at a position at which exposure can start. Once exposure has started, the substrate W will move down the page relative to the imaginary stationary projection system and at the same time the patterning device MA will be scanned from one extreme to the other. Once the top of the die 1 has been reached and exposed, exposure will stop and then the patterning device will be moved back to its start position and then exposure of the second die can start. There may or may not be a small step between the end of die 1 and the beginning of die 2. In this way the substrate is imaged in columns i.e. a (straight) line of dies which crosses the substrate is imaged with the substrate moving only in one direction. Many parallel columns of dies are imaged such that all the top surface of the substrate can be imaged. The direction of the movement of the substrate can conveniently alternate between adjacent columns. The step and scan movements of the substrate can be seen to have been combined.

Turning of the meander path on the substrate and under the liquid supply system IH is completely avoided by performing those turns outside of the substrate (and those turns would effectively be made on a top surface of the substrate table WT)

i.e. the turns are made when the substrate is not under the projection system as is illustrated by the dotted line 110. Once a first line of dies 112 has been imaged, the substrate W movement is reversed by 180° and a second line of dies 114 is imaged. In the case of the second line of dies 114, because the direction of overall movement of the substrate W has changed, the direction of scan will also change so that both the scan and step directions are the same. One way of looking at the meander path in FIG. 8 is that there is only stepping taking place at the end of each line of dies 112, 114. However, it may be necessary for a small step to take place between the end of exposing of one die and beginning of exposing the next die.

It is advantageous to ensure that once all dies have been exposed that the substrate table WT is so positioned under the projection system such that a closing plate CP positioned on the substrate table WT is close by (i.e. is on the same side of the substrate table WT as the liquid supply system IH is at the end of imaging of the substrate W). This will reduce throughput time. A closing plate can be seen as a dummy substrate which is placed on the underside of the liquid supply system IH, for example over the central aperture of the barrier member 12 of FIG. 5 or 6, in order to seal the barrier member 12 during substrate swap so that the liquid supply system IH can be kept full of liquid to prevent drying out of the final element of the projection system PS. This idea of ensuring that imaging stops at a convenient place can be implemented for other reasons too. For example, imaging can finish near a sensor which needs to be illuminated by the beam B or near an edge at which direct substrate table swap occurs (e.g. a new substrate table takes the place of an old one simply by moving in under the projection system behind the old substrate table as it moves out).

The meander path of FIG. 8 is approximately 30% less efficient in terms of amount of time it takes than the standard meander path illustrated in FIG. 7. This is partly to do with the need to move the patterning device MA back to its starting position during imaging of consecutive dies in a line of dies as well as the need to move the substrate at the end of a line of dies a little bit further in order that turning of the meander path can take place outside of the area of the substrate W. The throughput loss can be reduced by speeding up the movement of the patterning device.

Figure 9:
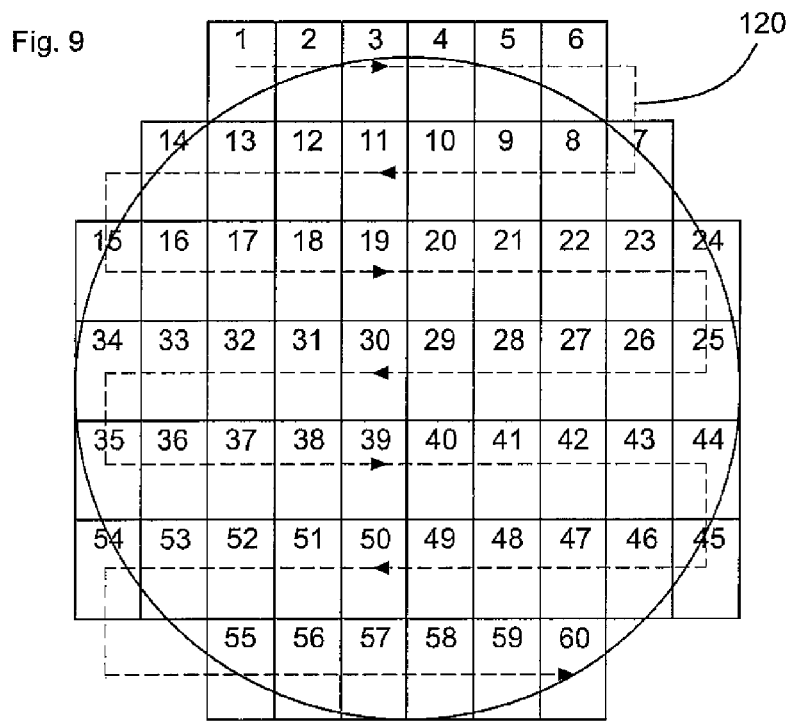
FIG. 9 illustrates an imaging route according to another embodiment of the invention.

FIG. 9 illustrates a meander path 120 of another embodiment. In this embodiment, the order of the dies to be exposed ensures that the top of the substrate W is exposed first and that all of the scan movements are downwards. A liquid supply system IH can move particles out of its way as the substrate travels underneath it so long as the particles have not had a chance to dry. Thus the idea of this embodiment is that the downwards scanning movement of each of the scans should result in a sweeping action of the top surface of the substrate so that particles will be pushed out to either side of the substrate and towards the bottom of the substrate. Of course the scanning and stepping could be upwards, for example if the geometry of the substrate table suited that. In an embodiment, the substrate does not pass under the liquid supply system IH after the last die has been exposed.

Although not illustrated in FIG. 9, the substrate W could be controlled by the controller such that turns of the meander path are only carried out when the substrate table WT rather than the substrate W is positioned under the projection system as in the embodiment above.

Figure 10:
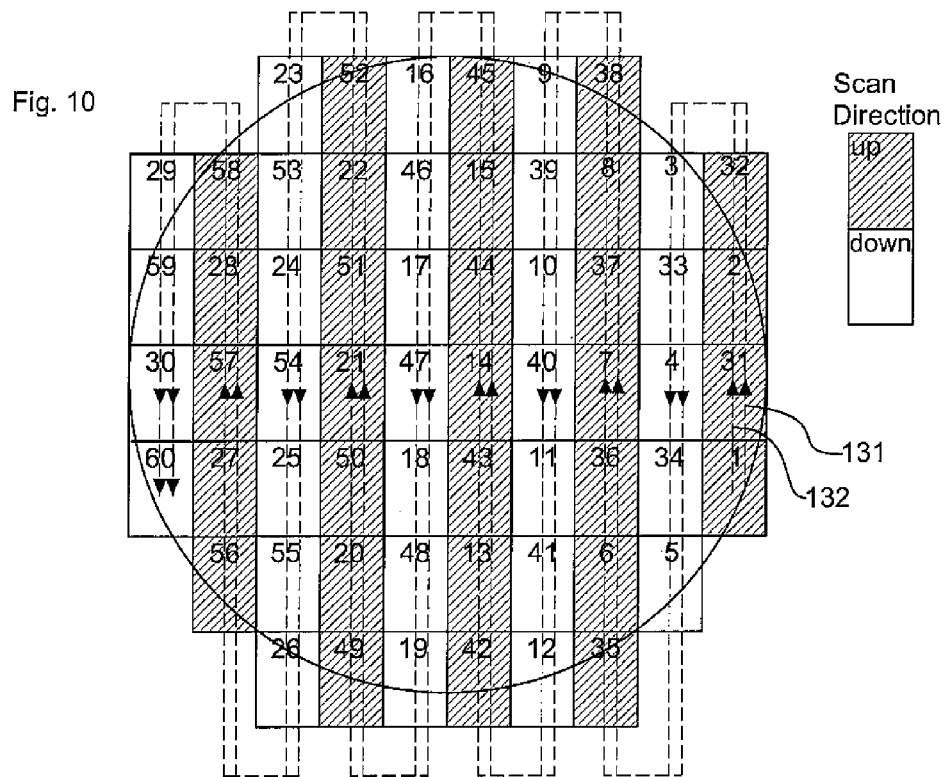
FIG. 10 illustrate an imaging route according to another embodiment of the invention.

In an embodiment illustrated in FIG. 10, the same path as in the embodiment described with respect to FIG. 8 is traversed. However, only every second die is exposed on the first pass 131 of the meander path and a second pass 132 is also performed in which those dies that were not exposed in the first pass 131 are exposed (each time by scanning in the same direction as the stepping direction). Thus die 1 is exposed by scanning, what will be die 31 is stepped over and die 3 is exposed by scanning, etc. The idea in this embodiment is that throughput should be increased because while the substrate W is being moved over the die which is not exposed it will be possible to move the patterning device MA back to the start position for the next scan in the same direction as the stepping movement. In this embodiment and the next in particular, the speed of the substrate table is kept substantially constant (or at least the stage keeps moving) during imaging of one line of dies so that stepping and scanning motions are performed at the same speed and without a change in speed at the transition. During the step period, the patterning device is moved back to the start position.

Figure 11:
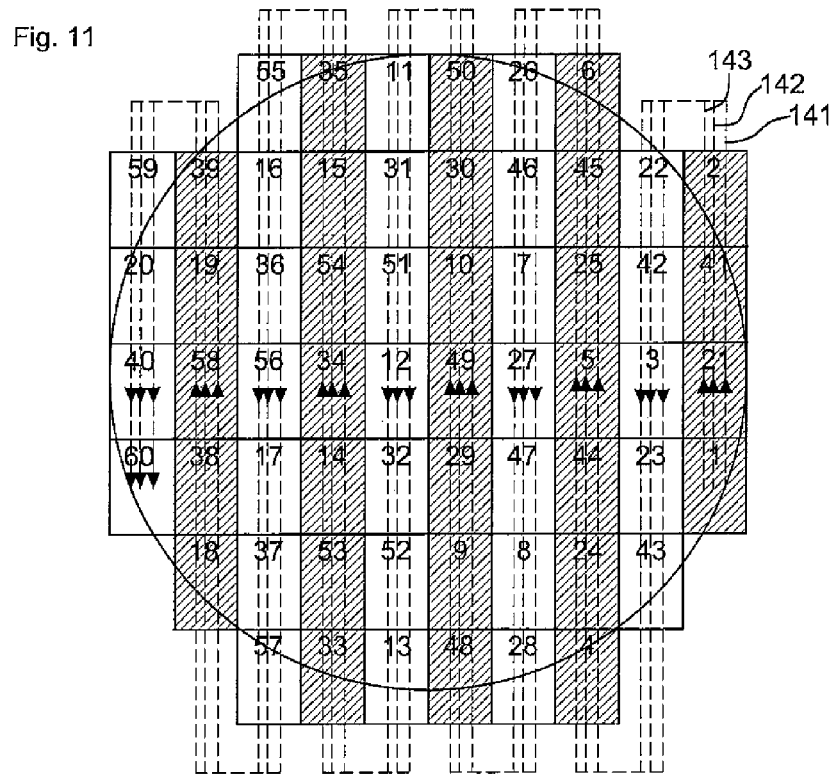
FIG. 11 illustrate an imaging route according to another embodiment of the invention.

Another embodiment is similar to that of the embodiment described with respect to FIG. 10 and is illustrated in FIG. 11. As can be seen from FIG. 11, three passes 141, 142, 143 of the meander path are traversed and only every third die is exposed. Otherwise the principles are the same as for the embodiment described with respect to FIG. 10.

Figure 12:
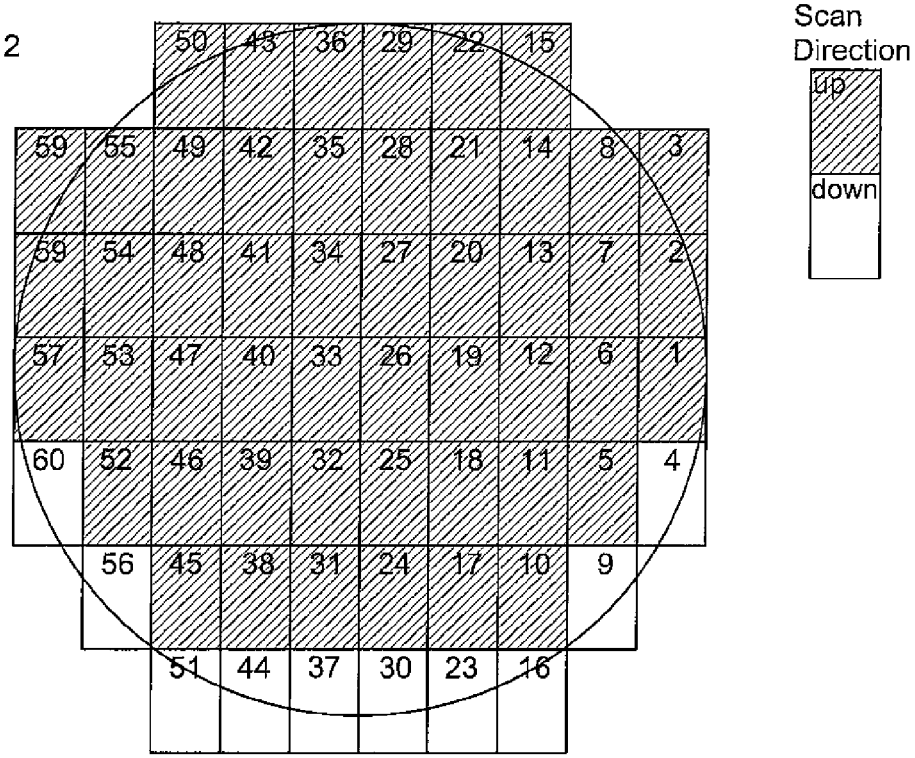
FIG. 12 illustrates an imaging route according to another embodiment of the invention.

Another embodiment is illustrated in FIG. 12. In this embodiment columns of dies are imaged. Each of the dies of a column (line) of dies except for the lowest die (as illustrated) is exposed during a combined scan and stepping motion in an upwards direction. The direction of the substrate W is then reversed and each of the dies passes under the projection system (as a step) until the bottom die of the line of dies is reached at which point it is scanned in a downwards direction as it is exposed. This is carried out for all ten columns of dies and means that the final pass of all areas of the substrate under the projection system is downwards and the aim is that all particles are pushed in front of the liquid supply system IH and towards the part of the substrate table WT at the bottom of the substrate W.

Figure 13:
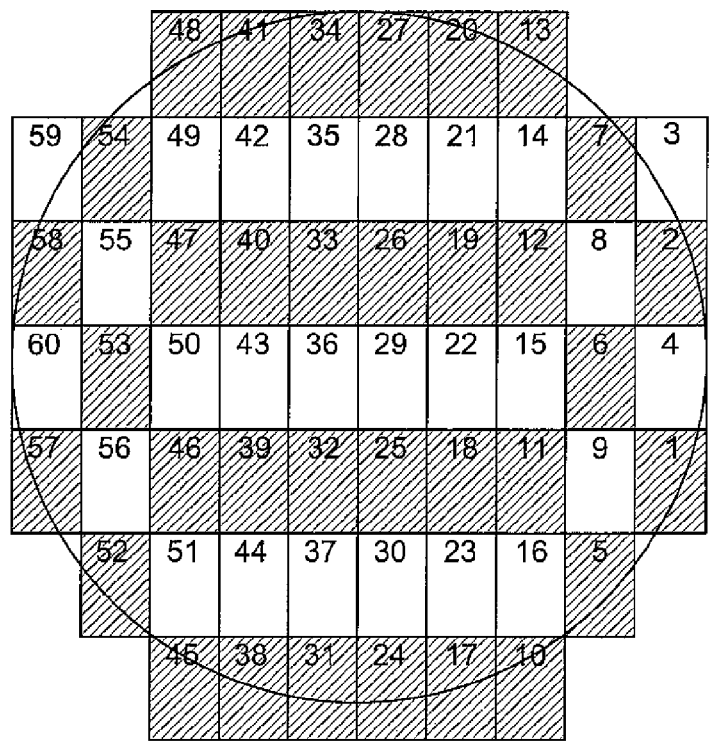
FIG. 13 illustrates an imaging route according to another embodiment of the invention.

Another embodiment is illustrated in FIG. 13. In this embodiment each column of dies passes under the projection system PS twice, first in an upwards direction and for a second time in a downwards direction. On each pass only every second die is exposed and it is exposed with a scanning motion in the same direction as the general movement of the substrate W. Thus in FIG. 13 in a first pass dies 1 and 2 are exposed with scanning in an upwards direction and what will be dies 4 and 3 are stepped over. After the substrate W has passed under the projection system the direction of movement of the substrate is reversed and dies 3 and 4 are exposed by being scanned in the downwards direction. Then the next line of dies comprising dies 5-9 are imaged in the same way, etc.

Figure 14:
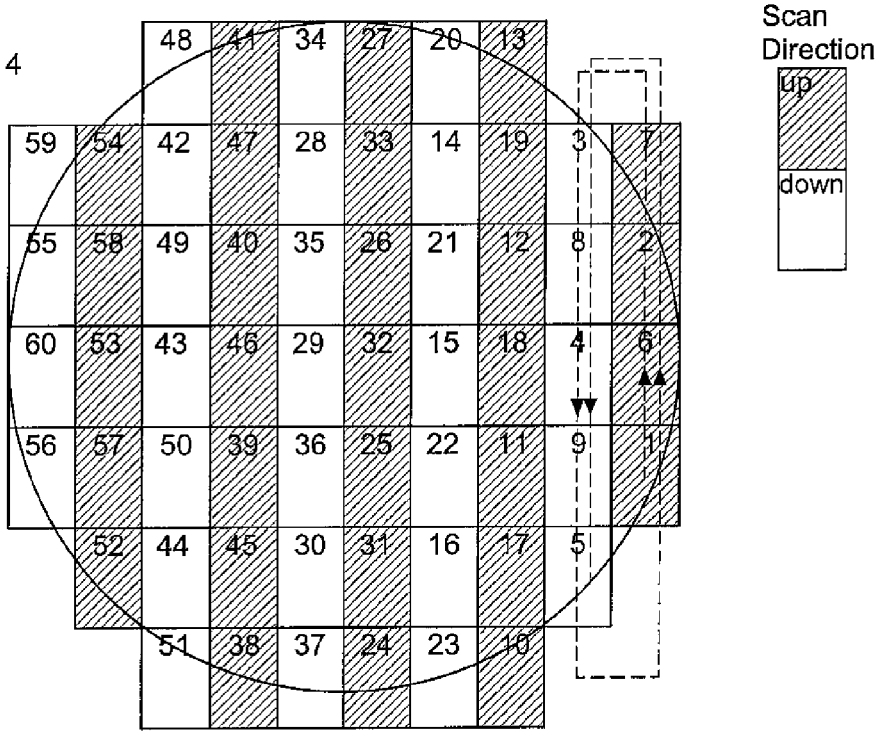
FIG. 14 illustrates an imaging route according to another embodiment of the invention.

Another embodiment is illustrated in FIG. 14. In this embodiment a circuit which encompasses two columns of dies is traversed twice in a row. In a first pass of the circuit, the dies of the first column pass under the projection system in an upwards direction and every second die is exposed. Thus on the first pass dies 1 and 2 are exposed by being scanned in the upwards direction. Then the dies 3, 4, 5 of the second column are exposed on a return path (e.g. every second die is exposed) in a downwards direction (the scanning during exposure is downwards). On the second pass of the circuit, the dies which were not exposed during the first pass of the circuit are exposed. Thus dies 6 and 7 are exposed with a scan in the upwards direction and dies 8 and 9 are exposed with a scan in the downwards direction.

Figure 15:
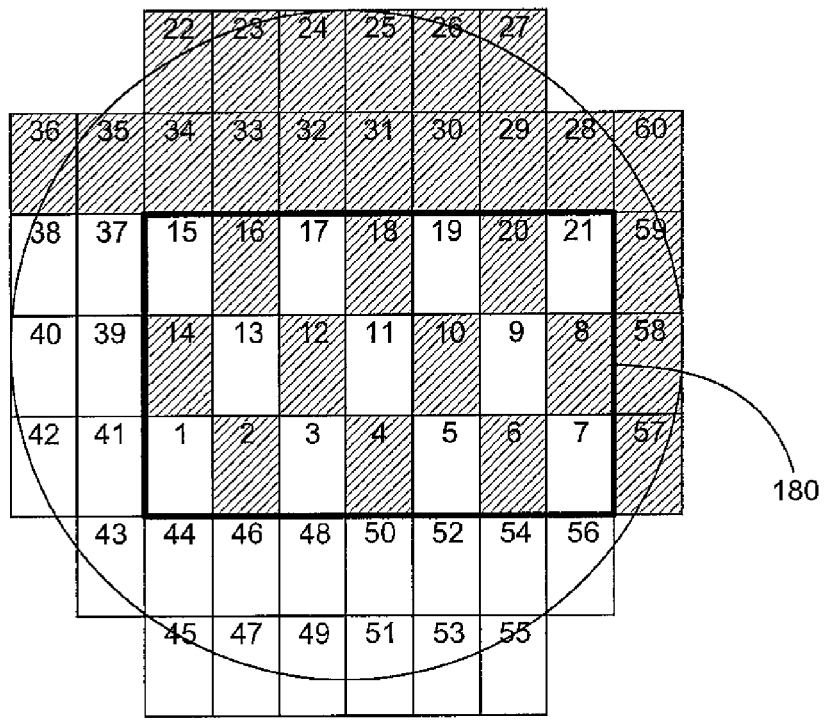
FIG. 15 illustrates an imaging route according to another embodiment of the invention.

Another embodiment is illustrated in FIG. 15. This embodiment is a hybrid embodiment which includes a central portion marked by box 180 which is scanned in the same way as the conventional scan illustrated in FIG. 7. That is, the scan and step directions are substantially perpendicular to one another. After that central section 180 has been imaged a sweeping path is followed in which particles above the central section 180 is moved above the substrate W whereas particles below the central section 180 are moved downwards to below the substrate W. This is accomplished by scanning away from the center of the substrate during exposure of dies outside of the central section 180.

In all of the embodiments the imaging can start and end anywhere, for example, in the embodiment described with respect to FIG. 8, imaging could start at the top right or top left or bottom left and end at the top left or top right or bottom right respectively. It should of course be appreciated that any feature of any embodiment can be combined with any other embodiment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
 a support constructed to support a patterning device, the patterning device being capable of imparting a radiation beam with a pattern in its cross-section to form a patterned radiation beam;
 a substrate table constructed to hold a substrate;
 a liquid supply system configured to provide liquid to a localized area of a top surface of a substrate;
 a projection system configured to project the patterned radiation beam onto a target portion of the substrate through the liquid; and
 a controller adapted to coordinate movement of the substrate table and the support during imaging of a line of dies across the substrate in a first direction such that movement of the substrate under the projection system in a plane substantially parallel to the top surface to image the line of dies is backwards and/or forwards only in a direction substantially parallel to the first direction which first direction is in the plane,
 wherein the controller is further adapted to, after the line of dies has been exposed, move the substrate in a second direction in the plane and substantially perpendicular to the first direction when the substrate is not under a space filled by liquid after an edge of the substrate passes across the localized area so that a localized surface of the substrate table replaces the substrate under the space and is in contact with said liquid and a last exposed die of said line of dies on said substrate is out of contact with said liquid, said space formed below and surrounded by a last optical element of the projection system, and then, during exposure of a second line of dies across the substrate, coordinate movement of the substrate table and the support such that movement of the substrate under the projection system in the plane to image the second line of dies is backwards and/or forwards only in a direction substantially parallel to the first direction.

2. The lithographic projection apparatus of claim 1, wherein the controller is adapted such that movement in the second direction occurs when the liquid supply system provides liquid to the localized area.

3. The lithographic projection apparatus of claim 1, wherein the controller is adapted such that the substrate is imaged by repeating the imaging of a plurality of lines of dies across the substrate and in an order such that after the last line of dies is imaged, the substrate table is positioned such that a closing plate on the substrate table, the closing plate configured to shut an aperture of the liquid supply system, is on the same side of the substrate as the liquid supply system.

4. The lithographic projection apparatus of claim 1, wherein the controller is adapted such that during the imaging of the line of dies, the substrate table only moves in one direction.

5. The lithographic projection apparatus of claim 1, wherein the controller is adapted such that the whole top surface of the substrate is imaged by the substrate table only moving under the projection system backwards and/or forwards in directions substantially parallel to the first direction during the imaging of each of a plurality of lines of dies.

6. The lithographic projection apparatus of claim 1, wherein the controller is adapted such that, during imaging of the line of dies, the substrate table is moved under the projection system so that each die passes under the projection system at least twice.

7. The lithographic projection apparatus of claim 6, wherein the controller is adapted such that consecutive dies in the line of dies are not scanned one after the other.

8. The lithographic projection apparatus of claim 1, wherein the controller is adapted such that all dies on the substrate are imaged as a part of a line of dies and such that the last time during the imaging that each last die at an end of a respective line of dies and which is situated in a first half of the substrate passes under the projection system, this is in a direction with a component outwards from the center of the substrate.

9. A lithographic apparatus comprising:
a support constructed to support a patterning device, the patterning device being capable of imparting a radiation beam with a pattern in its cross-section to form a patterned radiation beam;
a substrate table constructed to hold a substrate;
a liquid supply system configured to provide liquid to a localized area of a top surface of a substrate;
a projection system configured to project the patterned radiation beam onto a target portion of the substrate through the liquid; and
a controller adapted to control movement of the support and the substrate table such that:
the substrate table moves in a first direction in a plane substantially parallel to the top surface during imaging of a first line of dies and a second subsequent line of dies on the substrate; and
the substrate table is moved such that the substrate is scanned in the first direction during exposure of each of the dies of the first line of dies and the second subsequent line of dies,
wherein after imaging of dies of the second subsequent line of dies, dies of the first line of dies are imaged before imaging of a third line of dies.

10. The lithographic apparatus of claim 9, wherein at least two dies of the first line of dies are exposed during imaging the first line of dies before imaging any die of the subsequent line of dies.

11. A lithographic apparatus comprising:
a support constructed to support a patterning device, the patterning device being capable of imparting a radiation beam with a pattern in its cross-section to form a patterned radiation beam;
a substrate table constructed to hold a substrate;
a liquid supply system configured to provide liquid to a localized area of a top surface of a substrate;
a projection system configured to project the patterned radiation beam onto a target portion of the substrate through the liquid; and
a controller adapted to control movement of the support and the substrate table such that during imaging of a line of dies of a central section of the substrate scan movements are substantially perpendicular to step movements and during imaging of an outer area of the substrate all the dies in the outer area along a side of the central section are scanned in a direction away from the central section and off the substrate such that at the end of a scan for each of the dies in the outer area (i) the substrate is not under a space filled by liquid and formed below and surrounded by a last optical element of the projection system and said die on said substrate at the end of the scan is out of contact with said liquid and (ii) a localized surface of the substrate table replaces the substrate under the space and is in contact with said liquid.

12. A lithographic apparatus comprising:
a support constructed to support a patterning device, the patterning device being capable of imparting a radiation beam with a pattern in its cross-section to form a patterned radiation beam;
a substrate table constructed to hold a substrate;
a liquid supply system configured to provide liquid to a localized area of a top surface of a substrate;
a projection system configured to project the patterned radiation beam onto a target portion of the substrate through the liquid; and
a controller adapted to control movement of the support and the substrate table such that during imaging of at least a portion of a top surface of the substrate scan movements and step movements of the substrate table are at least partly combined as one movement or separate movements which are substantially parallel and along a first direction and each die of at least one line of dies imaged in succession is scanned off the substrate either forwards or backwards in a same direction,
wherein the controller is further adapted to, after said at least one line of dies has been exposed, move the substrate in a second direction in a plane of the substrate and substantially perpendicular to the first direction so that during movement of said substrate in the second direction a last exposed die of said at least one line of dies on said substrate is out of contact with said liquid and a localized surface of the substrate table replaces the substrate and is in contact with said liquid.

13. A lithographic apparatus comprising:
a support constructed to support a patterning device, the patterning device being capable of imparting a radiation beam with a pattern in its cross-section to form a patterned radiation beam;
a substrate table constructed to hold a substrate;
a liquid supply system configured to provide liquid to a localized area of a top surface of a substrate;
a projection system configured to project the patterned radiation beam onto a target portion of the substrate through the liquid; and
a controller adapted to control movement of the support and the substrate table such that during imaging of all dies on the substrate except each die at a same end of each line of dies on the substrate, all scan movements are in one same direction, either forwards or backwards.

14. The lithographic apparatus of claim 13, wherein the controller is adapted to control movement of the support and the substrate table such that after imaging all dies of a line of dies except the die at the end of said line of dies on the substrate, the substrate table moves the substrate in a reversed direction opposite said one direction so that the imaged dies of the line of dies are passed under the projection system.

15. The lithographic apparatus of claim 14, wherein the controller is adapted to control movement of the support and the substrate table such that after the imaged dies of the line of dies are passed under the projection system in the reversed direction, the die at the end of said line of dies is scanned in the reversed direction.

16. A device manufacturing method comprising using a projection system to project a patterned beam of radiation onto a substrate through liquid provided on a localized area between the projection system and the substrate, wherein a line of dies across a substrate in a first direction is imaged by movement of the substrate under the projection system in a plane substantially parallel to the top surface to image the line of dies backwards and/or forwards only in a direction substantially parallel to the first direction which first direction is in the plane, and, after the line of dies has been exposed, moving the substrate in a second direction in the plane and substantially perpendicular to the first direction when the substrate is not under a space filled by liquid after an edge of the substrate passes across the localized area so that a localized surface of the substrate table replaces the substrate under the space and is in contact with said liquid and a last exposed die of said line of dies on said substrate is out of contact with said liquid, said space formed below and surrounded by a last optical element of the projection system and then a second line of dies across the substrate is imaged by movement of the substrate under the projection system in the plane to image the second line of dies backwards and/or forwards only in a direction substantially parallel to the first direction.

17. A device manufacturing method comprising:
  using a projection system to project a patterned beam of radiation onto a substrate through liquid provided between the projection system and the substrate, wherein a first line of dies and a second subsequent line of dies is imaged by moving the substrate in a first direction in a plane substantially parallel to a top surface of the substrate, and
  controlling the patterned beam of radiation such that:
    the substrate is scanned in the first direction during exposure of each of the dies of the first line of dies and the second subsequent line of dies,
    wherein after imaging of dies of the second subsequent line of dies, dies of the first line of dies are imaged before imaging of a third line of dies.

18. A device manufacturing method comprising using a projection system to project a patterned beam of radiation onto a substrate through liquid provided between the projection system and the substrate, wherein during imaging of a line of dies of a central section of the substrate scan movements are substantially perpendicular to step movements and during imaging of an outer area of the substrate all the dies in the outer area along a side of the central section are scanned in a direction away from the central section and off the substrate such that at the end of a scan for each of the dies in the outer area (i) the substrate is not under a space filled by liquid and formed below and surrounded by a last optical element of the projection system and said die on said substrate at the end of the scan is out of contact with said liquid and (ii) a localized surface of a substrate table that supports the substrate replaces the substrate under the space and is in contact with said liquid.

19. A device manufacturing method comprising using a projection system to project a patterned beam of radiation onto a substrate through liquid provided between the projection system and the substrate, wherein scan movements and step movements of the substrate are at least partly combined as one movement or separate movements which are substantially parallel and along a first direction and each die of at least one line of dies imaged in succession is scanned off the substrate either forwards or backwards in a same direction, wherein the controller is further adapted to, after said at least one line of dies has been exposed, move the substrate in a second direction in a plane of the substrate and substantially perpendicular to the first direction so that during movement of said substrate in the second direction a last exposed die of said at least one line of dies on said substrate is out of contact with said liquid and a localized surface of a substrate table that supports the substrate replaces the substrate and is in contact with said liquid.

20. A device manufacturing method comprising using a projection system to project a patterned beam of radiation onto a substrate through liquid provided between the projection system and the substrate, wherein during imaging of all dies on the substrate except each die at a same end of each line of dies on the substrate, all scan movements are in one same direction, either forwards or backwards.

* * * * *